(12) United States Patent
Kuczynski et al.

(10) Patent No.: US 10,750,622 B2
(45) Date of Patent: Aug. 18, 2020

(54) CONDUCTIVE POLYMERS WITHIN DRILLED HOLES OF PRINTED CIRCUIT BOARDS

(71) Applicant: International Business Machines Corporation, Armonk, NY (US)

(72) Inventors: Joseph Kuczynski, North Port, FL (US); Timothy Tofil, Rochester, MN (US); Jeffrey N. Judd, Oronoco, MN (US); Matthew Doyle, Chatfield, MN (US); Scott D. Strand, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/373,693

(22) Filed: Apr. 3, 2019

(65) Prior Publication Data
US 2019/0230797 A1 Jul. 25, 2019

Related U.S. Application Data

(63) Continuation of application No. 15/796,888, filed on Oct. 30, 2017, now Pat. No. 10,334,741, which is a
(Continued)

(51) Int. Cl.
*H01K 3/10* (2006.01)
*H05K 3/38* (2006.01)
(Continued)

(52) U.S. Cl.
CPC ........ *H05K 3/386* (2013.01); *H01L 21/02118* (2013.01); *H05K 1/0292* (2013.01); *H05K 3/4069* (2013.01); *H05K 3/429* (2013.01);

*H05K 1/0251* (2013.01); *H05K 1/0298* (2013.01); *H05K 2201/0329* (2013.01); *Y10T 29/49165* (2015.01)

(58) Field of Classification Search
CPC .... H05K 3/386; H05K 1/0292; H05K 3/4069; H05K 3/429; H05K 2201/0329; H05K 1/0298; H05K 1/0251; H01L 21/02118; B81B 3/0035; Y10T 29/49165; Y10T 29/49204
USPC .......................................... 29/852, 874, 876
See application file for complete search history.

(56) References Cited

U.S. PATENT DOCUMENTS

| | | | |
|---|---|---|---|
| 4,273,682 | A | 6/1981 | Kanamori |
| 4,968,931 | A | 11/1990 | Littlebury et al. |

(Continued)

FOREIGN PATENT DOCUMENTS

WO 2010127496 A1 11/2010

OTHER PUBLICATIONS

Unknown, "Silicone Rubber Technical Information", Mosites Rubber Company, Inc., printed Jun. 27, 2017, 17 pages.
(Continued)

*Primary Examiner* — Donghai D Nguyen
(74) *Attorney, Agent, or Firm* — Nicholas D. Bowman

(57) ABSTRACT

A triggering condition is applied to a conductive polymer positioned in a drilled hole in a printed circuit board. The applied triggering condition causes the polymer to vertically expand within the drilled hole such that the expanded polymer creates an electrically conductive path between contact pads located in different layers of the printed circuit board.

6 Claims, 8 Drawing Sheets

Related U.S. Application Data continuation of application No. 15/650,227, filed on Jul. 14, 2017.

(51) Int. Cl.
*H01L 21/02* (2006.01)
*H05K 3/42* (2006.01)
*H05K 1/02* (2006.01)
*H05K 3/40* (2006.01)

(56) References Cited

U.S. PATENT DOCUMENTS

| | | |
|---|---|---|
| 5,189,261 A | 2/1993 | Alexander et al. |
| 5,604,446 A | 2/1997 | Sano |
| 5,758,413 A | 6/1998 | Chong et al. |
| 5,906,042 A | 5/1999 | Lan et al. |
| 5,962,815 A | 10/1999 | Lan et al. |
| 6,062,872 A | 5/2000 | Strange et al. |
| 6,312,621 B1 | 11/2001 | Pedigo et al. |
| 6,631,558 B2 | 10/2003 | Burgess |
| 7,666,008 B2 | 2/2010 | Levante et al. |
| 7,698,813 B2 | 4/2010 | Wang |
| 8,225,500 B2 | 7/2012 | Levante et al. |
| 8,241,957 B2 * | 8/2012 | Hougham ............ B81B 3/0035 257/E23.067 |
| 8,302,301 B2 | 11/2012 | Lau |
| 8,456,017 B2 | 6/2013 | Dai et al. |
| 8,469,724 B1 | 6/2013 | Barnette et al. |
| 8,499,442 B2 | 8/2013 | Levante et al. |
| 9,013,102 B1 | 4/2015 | Wedding et al. |
| 9,110,017 B2 | 8/2015 | Pollack et al. |
| 9,805,891 B2 | 10/2017 | Beroz |
| 2008/0035271 A1 | 2/2008 | Hsu et al. |
| 2013/0240264 A1 | 9/2013 | Barezzani |
| 2014/0083754 A1 | 3/2014 | Mundt et al. |
| 2018/0027665 A1 | 1/2018 | Doyle et al. |
| 2019/0021172 A1 | 1/2019 | Kuczynski et al. |
| 2019/0021173 A1 | 1/2019 | Kuczynski et al. |
| 2019/0021174 A1 | 1/2019 | Kuczynski et al. |

OTHER PUBLICATIONS

Accelerated Examination Support Document, U.S. Appl. No. 15/886,071, filed Dec. 9, 2017, 8 pages.

IBM, List of IBM Patents or Patent Applications Treated as Related, Apr. 2, 2019, 2 pages.

\* cited by examiner

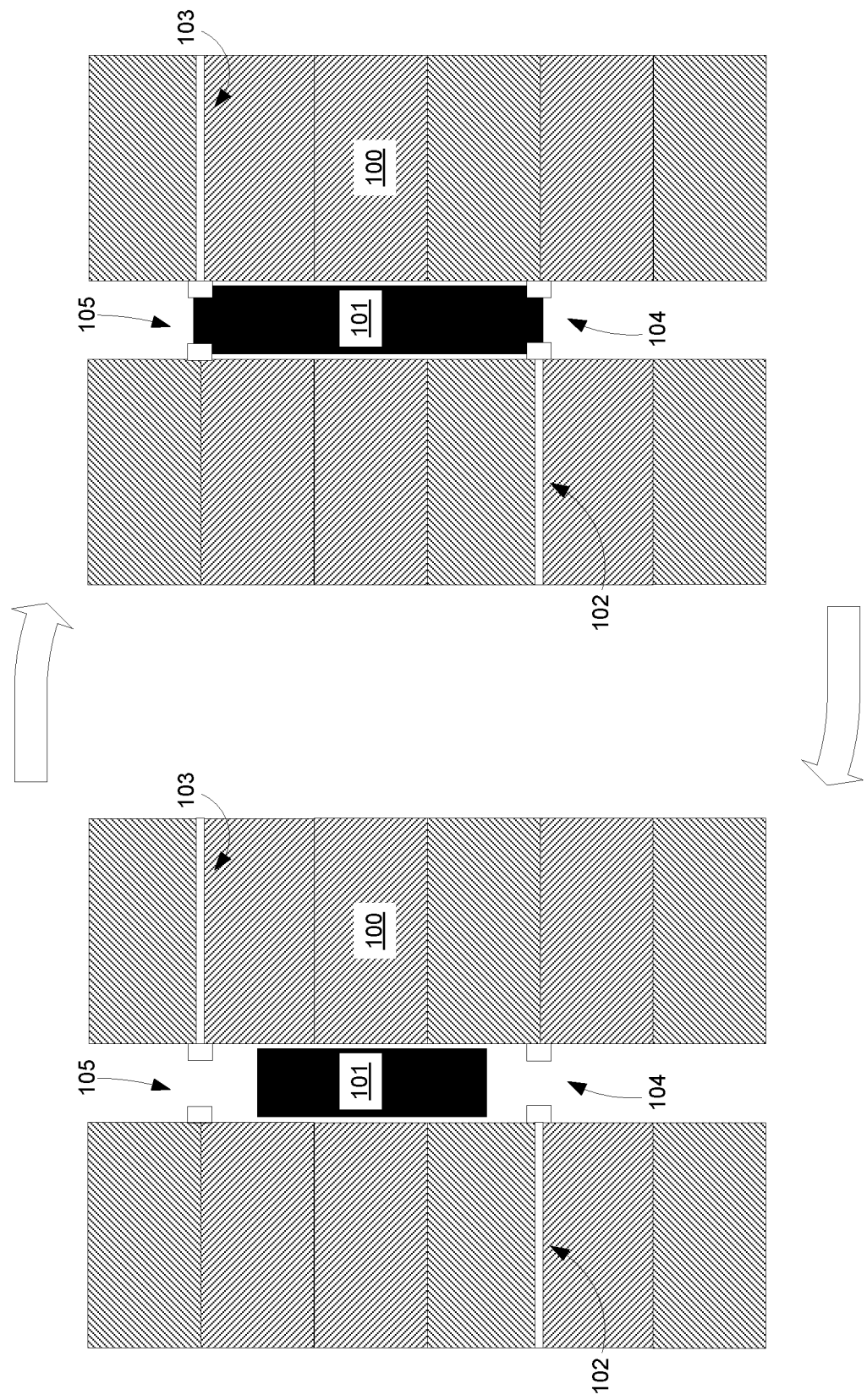

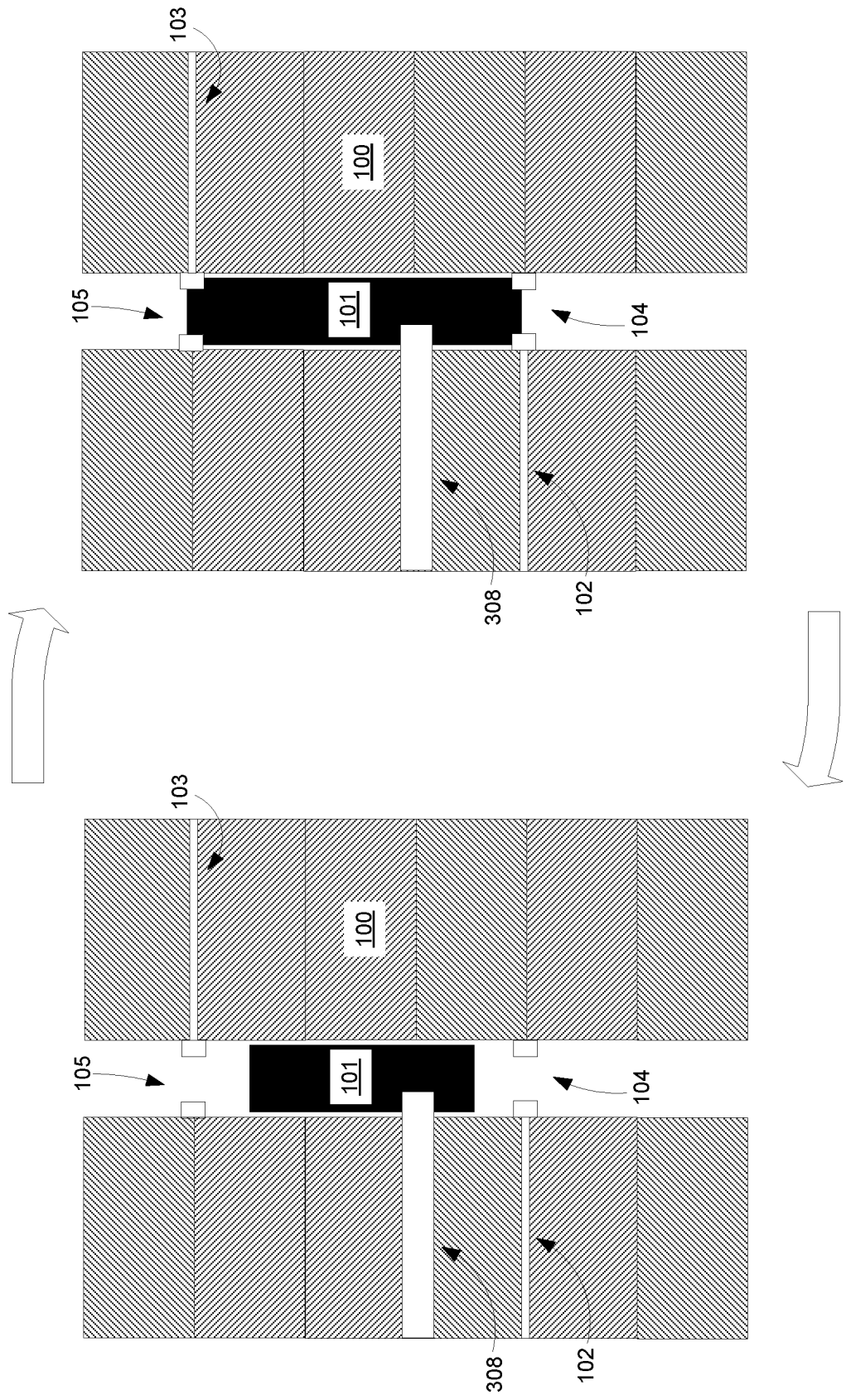

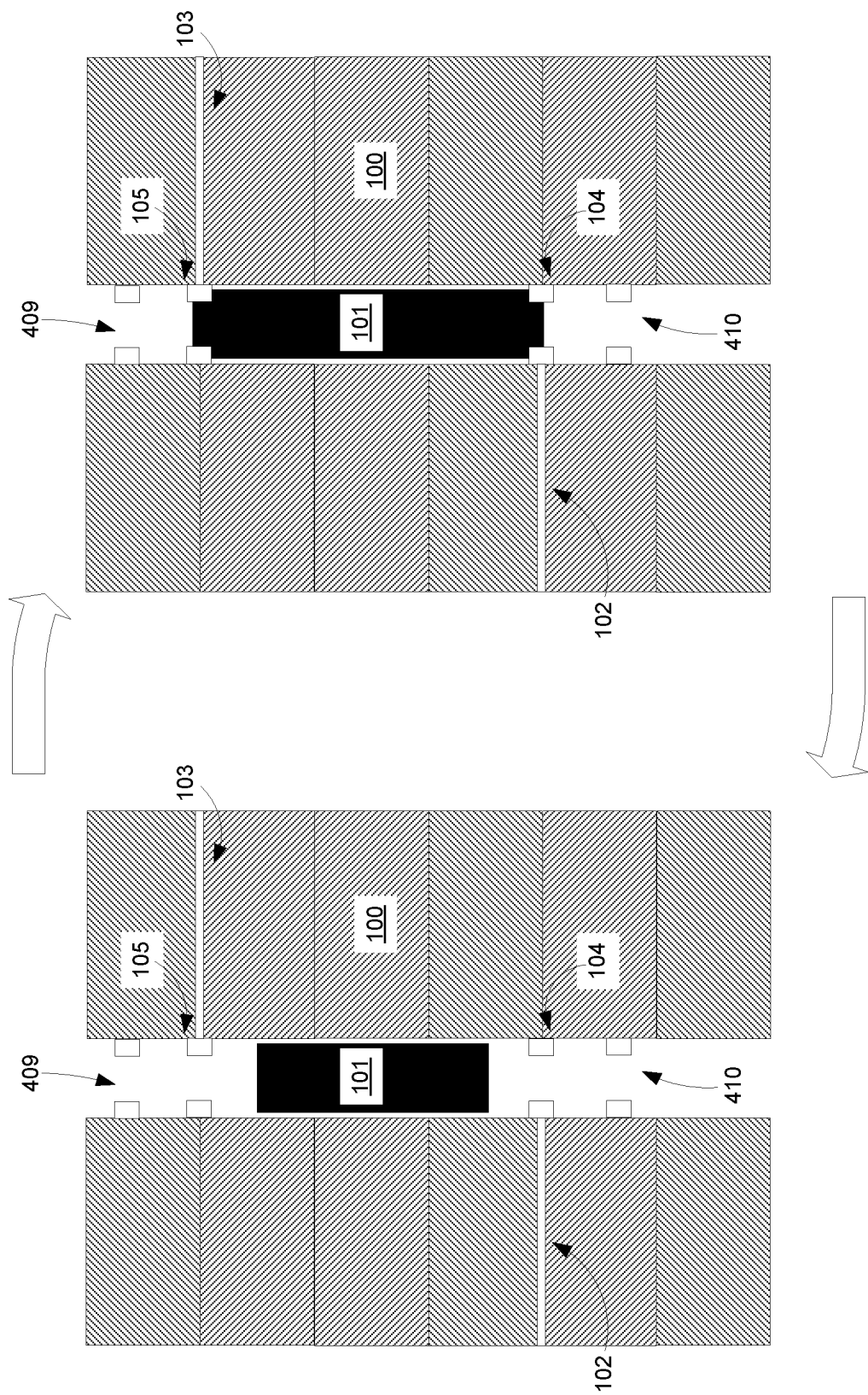

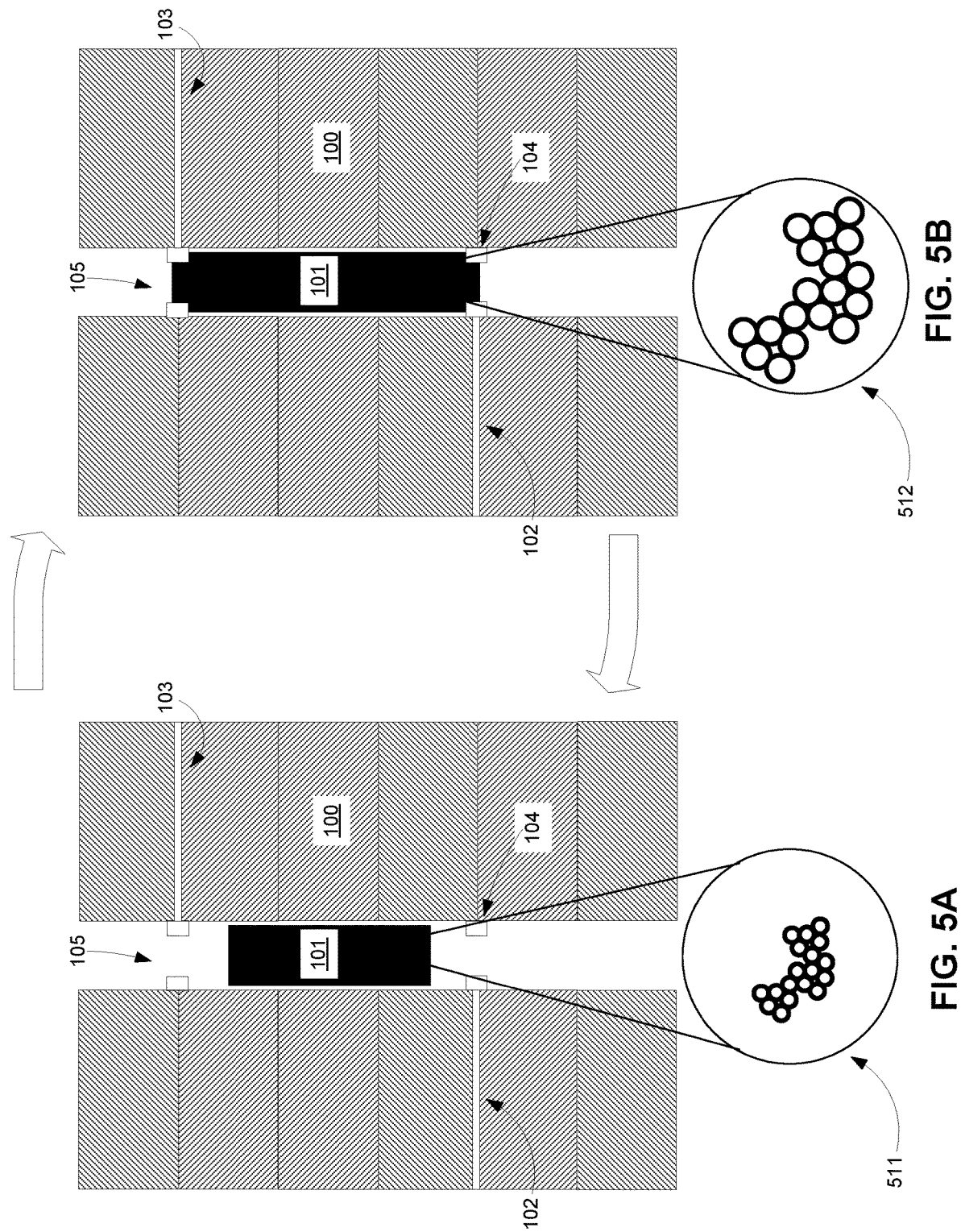

CONDUCTIVE POLYMERS WITHIN DRILLED HOLES OF PRINTED CIRCUIT BOARDS

BACKGROUND

The present disclosure relates generally to printed circuit boards, and, more particularly, to the expansion and contraction of conductive polymers within drilled holes of printed circuit boards.

Often multiple vias are used in a multi-layered printed circuit board to electrically connect annular contact pads of conductive traces in differing (conductive) layers of the board. During the manufacturing of the printed circuit board, the vias may be created by plating drilled holes in the board with a conductive material (typically copper). The entire depth of the via, including an unused portion of the via called a stub, is generally plated with the copper material. Left unchanged, the plated stub portion may adversely degrade electrical signals traveling through the desired portion of the via (i.e., into a contact pad of a desired trace escape layer) during use of the completed circuit board. In order to reduce the impact of stubs on circuit board performance, the stubs may be removed from the board, or at least shortened, during the manufacturing process by means such as backdrilling.

SUMMARY

Embodiments of the present disclosure include a method. As part of the method, a triggering condition is applied to a conductive polymer positioned in a drilled hole in a printed circuit board. The applied triggering condition causes the polymer to vertically expand within the drilled hole such that the expanded polymer creates an electrically conductive path between contact pads located in different layers of the printed circuit board.

Embodiments of the present disclosure further include a computer program product. The computer program product is a computer readable storage medium that has program instructions embodied thereon. The program instructions are configured to cause a processor to perform a method. As part of the method, a command is sent to apply a triggering condition to a conductive polymer positioned in a drilled hole in a printed circuit board to vertically expand the polymer within the drilled hole such that the expanded polymer creates an electrically conductive path between contact pads located in different layers of the printed circuit board.

Embodiments of the present disclosure further include a printed circuit board. The printed circuit board includes a conductive polymer positioned in a drilled hole in the printed circuit board. The polymer is configured to respond to an applied triggering condition by vertically expanding within the drilled hole such that the expanded polymer creates an electrically conductive path between contact pads located in different layers of the printed circuit board.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIGS. 1A and 1B illustrate cross-sectional views of a drilled hole in a printed circuit board, wherein the drilled hole includes a conductive polymer plug in a contracted form and an expanded form, respectively, and wherein the expansion of the conductive polymer creates an electrical connection between contact pads of trace layers of the printed circuit board, in accordance with embodiments of the present disclosure.

FIGS. 3A and 3B illustrate the views of the drilled hole of FIGS. 1A and 1B, wherein the conductive polymer is a conductive elastomer, and wherein the expansion and contraction of the conductive elastomer is caused by variably using a heating filament embedded in the printed circuit board, in accordance with embodiments of the present disclosure.

FIGS. 4A and 4B illustrate the views of the drilled hole of FIGS. 1A and 1B, wherein the conductive polymer is an electroactive polymer, and wherein the expansion and contraction of the electroactive polymer is caused by variably applying voltage to the polymer via a voltage drop across an additional pair of contact pads in the drilled hole of the printed circuit board, in accordance with embodiments of the present disclosure.

FIGS. 5A and 5B illustrate the views of the drilled hole of FIGS. 1A and 1B, wherein the conductive polymer includes rounded, gas-filled, elastomeric microspheres, and wherein the expansion and contraction of the electroactive polymer is caused by variably applying air pressure changes within the drilled hole of the printed circuit board, in accordance with embodiments of the present disclosure.

Figures 2A, 2B:
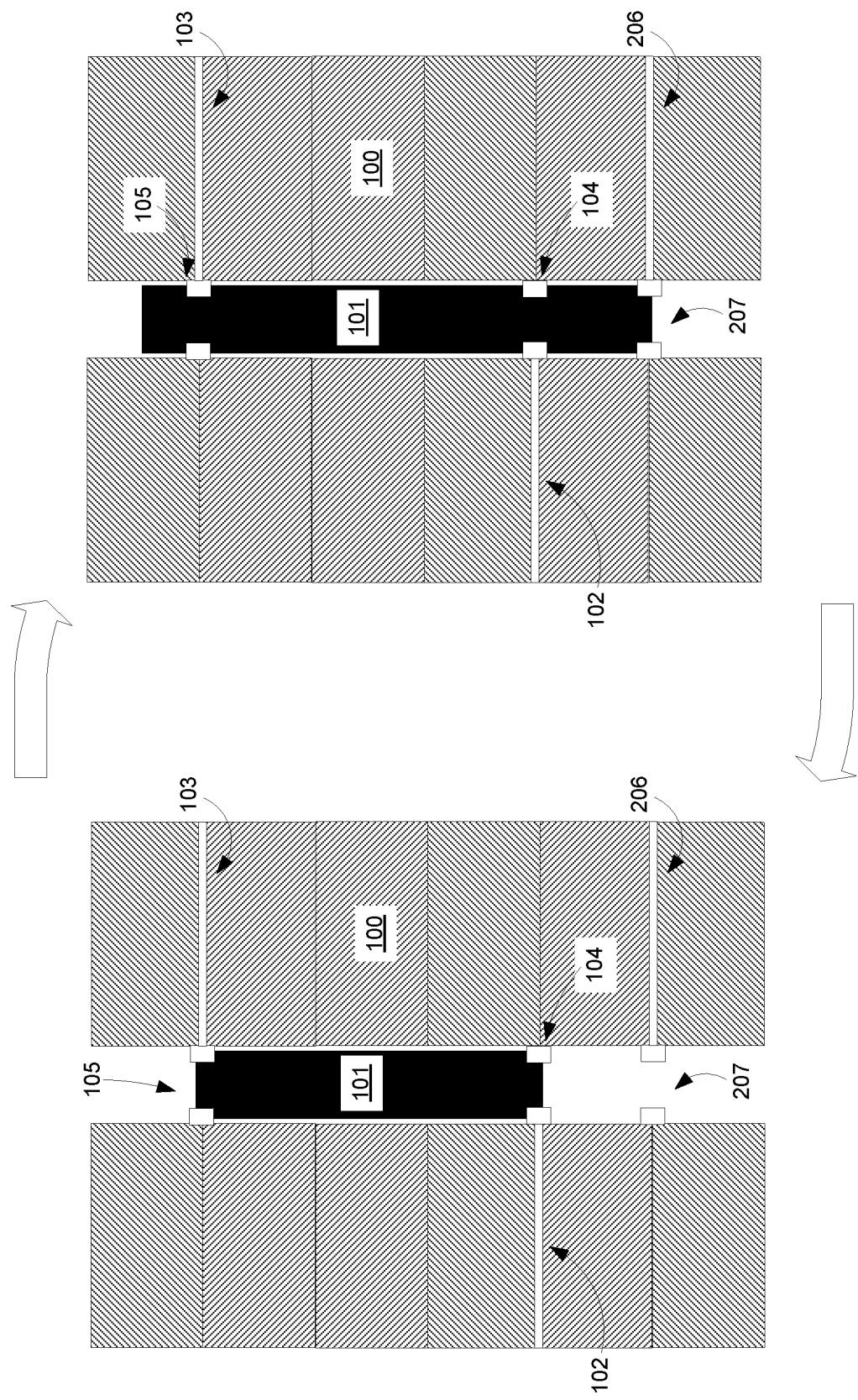
FIGS. 2A and 2B illustrate the views of the drilled hole of FIGS. 1A and 1B, wherein the expansion of the conductive polymer severs the electrical connection between the contact pads of the trace layers in the printed circuit board, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to printed circuit boards, and, more particularly, to the expansion and contraction of conductive polymers within drilled holes of printed circuit boards. While the present disclosure is not necessarily limited to such applications, various aspects of the disclosure may be appreciated through a discussion of various examples using this context.

As discussed above, the conductive plating material used in printed circuit board vias can often cause significant issues with signal degradation as electric current passes through the vias. In some embodiments, by using conductive polymers, instead of copper plating, in drilled holes, this risk of signal degradation can be greatly reduced. In addition, the use of conductive polymer plugs in printed circuit boards may offer significant flexibility in how electrical connections are variably made and broken across layers of the board.

Referring now to the figures, shown in FIGS. 1A and 1B are cross-sectional views of a drilled hole in a printed circuit board 100, wherein the drilled hole includes a conductive polymer plug 101 in a contracted form and an expanded form, respectively, and wherein the expansion of the conductive polymer creates an electrical connection between contact pads 104 and 105 of trace layers 102 and 103 of the printed circuit board 100, in accordance with embodiments of the present disclosure. In embodiments, the plug 101 may be solid or porous and shaped regularly or irregularly. As shown in FIG. 1A, the plug 101 is in a contracted (un-stressed) form. In this view, the contracted polymer does not contact either of the contact pads 104 or 105. In FIG. 1B, a triggering condition applied to the plug 101 causes it to expand vertically (relative to the plane of the printed circuit board 100), because horizontal expansion is largely constrained by the walls of the drilled hole, and come into contact with both contact pads 104 and 105. This expansion creates an electrical connection (electrical path) between the contact pads 104 and 105 (and their respective traces, 102 and 103) such that an electrical current can pass within the plug 101 across the drilled hole. In some embodiments, this electrical path across the plug 101 allows electronic communication (e.g., messaging) to occur over the plug 101. In some embodiments, the unexpanded plug 101 may already be in contact with one of the contact pads 104 or 105 and the expansion may cause it to come into contact with the other contact pad as well in order to create the desired electrical connection.

As indicated by the arrows between FIGS. 1A and 1B, the transformation of the plug 101 from a contracted state to an expanded state is reversible in some embodiments. For example, in some embodiments, by withdrawing the triggering condition from the expanded plug 101, the plug contracts back down to its original state, thereby severing (e.g., breaking) the electrical connection between the contact pads 104 and 105. In other embodiments, the plug 101 remains in the expanded state after the triggering condition is withdrawn and does not contract until a new triggering condition is applied.

Referring now to FIGS. 2A and 2B, shown are the views of the drilled hole of FIGS. 1A and 1B, wherein the expansion of the conductive polymer 101 severs the electrical connection between the contact pads 104 and 105 of the trace layers 102 and 103 in the printed circuit board 100, in accordance with embodiments of the present disclosure. In contrast with the embodiments of FIGS. 1A and 1B where the expansion of the plug 101 created the electrical connection, in this instance the expansion of the plug effectively breaks the relevant electrical connection. Specifically, in the embodiment of FIGS. 2A and 2B, an additional contact pad 207 is located in the drilled hole outside of the portion between the contact pads 104 and 105. The contact pad 207 is connected to a grounded trace 206. As shown in FIG. 2A, the plug 101 in the contracted form acts as an electrical connection between traces 102 and 103 over which electrical signals can pass. By applying a triggering condition, the plug 101 is expanded so as to create an electrical connection between the trace 102 and the grounded trace 206 (as shown in FIG. 2B). This connection between traces 102 and 206 effectively severs the conductive path between traces 102 and 103 by creating a grounded path towards which signals passing along trace 102 will travel. Similar to the embodiment of FIGS. 1A and 1B, the transformation of plug 101 may be reversible such that the upon return to its contracted form, the electrical path between traces 102 and 103 is recreated.

It should be noted that, in some embodiments, the phrases "contracted form" and "expanded form" and the like may be relative phrases that are on a spectrum of expansion. The quantity of the triggering condition that is applied to the conductive polymer may cause the expansion of the polymer to vary across this spectrum. For example, in the embodiment of FIGS. 2A and 2B, the plug 101 in its natural (unstressed) state may be small (short) enough to fit between the contact pads 104 and 105 while not contacting either. Then, upon the application of a first quantity of a triggering condition, the plug may expand to the state shown in FIG. 2A, and later, upon the application of a second (larger) quantity of the triggering condition, the plug may expand further to the state shown in FIG. 2B. Such an embodiment that allows variable expansion/contraction may have significant advantages in allowing multiple (e.g., two or three or more) electrical connections through a single plug depending on desired signal paths through a printed circuit board.

As discussed herein, embodiments of the disclosure contemplate a wide variety of triggering conditions that can be applied in different situations depending on the types of polymers used and the results desired. Examples of triggering conditions include applied changes in temperature, pressure, and voltage that apply stress to a particular type of polymer used in a printed circuit board. In some embodiments, these triggering conditions are applied intentionally and in a controlled manner. For example, the triggering conditions may be applied in response to commands from processors in order to variably make and break electrical connections as necessary for communication across the printed circuit board (between components such as integrated circuits, other processors, memory modules, etc.).

In other embodiments, the triggering conditions may be applied unintentionally and/or in an uncontrolled manner. For example, the triggering condition may be excessive heat or voltage and the responsive expansion of a polymer plug may be designed as a fail-safe mechanism or the like in order to prevent the excessive applied condition from damaging the printed circuit board or other nearby components. Such embodiments may be useful for preventing runaway conditions (e.g., thermal runaway, voltage runaway, current runaway) from occurring, or if they do start occurring, to stop them or prevent damage from them.

Other uses of embodiments of the disclosure are also contemplated. For example, embodiments may be useful in changing the way that circuits within a printed circuit board communicate or otherwise operate under different conditions (e.g., modifying electrical paths during high temperature operation or changing communication methods across drilled holes during periods of low pressure, etc.) or at different points during the product lifecycle of the printed circuit board or a computer in which it is incorporated.

Referring now to FIGS. 3A and 3B, shown are the views of the drilled hole of FIGS. 1A and 1B, wherein the conductive polymer 101 is a conductive elastomer, and wherein the expansion and contraction of the conductive elastomer is caused by variably using a heating filament 308 embedded in the printed circuit board 100, in accordance with embodiments of the present disclosure. The filament 308 may be positioned in, near, or around the polymer 101. In some embodiments, the filament 308 may be a thick resistive material that generates heat when current is applied to it by one or more conductive traces within the printed circuit board 100.

In some embodiments, generating heat in the filament 308 causes the polymer 101 to expand (in a transition from the contracted form in FIG. 3A to the expanded form in FIG. 3B) and create an electrical connection between the contact pads 104 and 105. Withdrawing this heat (e.g., cooling the filament 308) reverses the process and contracts the polymer 101 back to the state shown in FIG. 3A. In other embodiments (not depicted) the heat may be applied to the polymer 101 by means other than filament 308, such as by inserting a heated probe into the drilled hole or by heating the printed circuit board 100 generally or in the area surrounding the drilled hole.

A variety of different conductive elastomers may be used in embodiments. For example, the conductive elastomer may comprise a composite with a polymer (e.g., silicone, plasticized epoxy) matrix and an electrically conductive filler (e.g., gold, copper, silver, silver-plated copper, silver plated glass beads, or nanoparticles such as carbon) or other metalized polymer interconnect materials. For another example, the conductive elastomer may comprise metal fibers coated with polymers.

In some embodiments, the conductive elastomer may be selected for use based on having certain characteristics, such as high volume expansion rates (e.g., three to ten percent) in relatively short periods of time at relatively low temperatures (e.g., below two-hundred-fifty degrees Celsius, or between two-hundred-ten and two-hundred-thirty-five degrees Celsius). This ability to expand at low temperatures may be significant in protecting the printed circuit board itself from thermal damage. Such elastomers may be particularly suited for embodiments, as typical printed circuit boards are not usually damaged by exposure to these low temperatures (at least not for short periods of time).

Referring now to FIGS. 4A and 4B, shown are views of the drilled hole of FIGS. 1A and 1B, wherein the conductive polymer 101 is an electroactive polymer, and wherein the expansion and contraction of the electroactive polymer is caused by variably applying voltage to the polymer 101 via a voltage drop across an additional pair of contact pads 409 and 410 in the drilled hole of the printed circuit board 100, in accordance with embodiments of the present disclosure. In some embodiments, electroactive polymers may show significant expansion rates in response to applied voltage stimulations. Examples of electroactive polymers include dielectric electroactive polymers and ionic electroactive polymers. Dielectric electroactive polymers include, but are not limited to, ferroelectric polymers, electrostrictive graft polymers, and liquid crystalline polymers. Ionic electroactive polymers include, but are not limited to, ionic polymer-metal composites, electroheological fluids, and stimuli-responsive gels.

There are a variety of means for applying voltage stimulation to electroactive polymers in accordance with embodiments. In some embodiments, one or two electrical probes inserted within the drilled hole may apply the voltage. In other embodiments, the voltage may be applied across the same contact pads which the expanded polymer electrically connects (e.g., contact pads 104 and 105). In the example depicted in FIGS. 4A and 4B, the voltage is applied across the polymer 101 via two contact pads 409 and 410 located outside of the portion of the drilled hole between contact pads 104 and 105. When the voltage is created, the polymer 101 expands (e.g., to the expanded form shown in FIG. 4B). In some embodiments, the expansion is reversible and the polymer 101 returns to the original contracted state, either upon withdrawal of the original voltage or upon application of a new voltage.

In some embodiments, the electroactive polymer may be selected for use based on having certain characteristics, such as high volume expansion rates (e.g., three to ten percent) in relatively short periods of time at relatively low voltages (e.g., between one volt and ten volts or less). This ability to expand at low voltage may be significant in protecting the printed circuit board itself from voltage damage. Such electroactive polymers may be particularly suited for embodiments, as typical printed circuit boards are not usually damaged by exposure to these low voltages (e.g., twelve volts or less), at least not for short periods of time. In addition, in some embodiments, any voltage that is created by current passing through the polymer 101 during normal electrical signaling may be negligible by comparison (e.g., below one volt), thus preventing improper expansion of the polymer when undesirable.

Referring now to FIGS. 5A and 5B, shown are views of the drilled hole of FIGS. 1A and 1B, wherein the conductive polymer 101 includes rounded, gas-filled, elastomeric microspheres, and wherein the expansion and contraction of the electroactive polymer is caused by variably applying air pressure changes within the drilled hole in the printed circuit board 100, in accordance with embodiments of the present disclosure. As shown in zoom view 511, the microspheres (e.g., rounded gas pockets coated with elastomeric shells) are contracted under normal pressure conditions. Upon a decrease in pressure, the microspheres expand causing the polymer 101 to transition to the expanded form shown in zoom view 512 of FIG. 5B. Once the pressure is raised again, the process is reversed, and the polymer returns to the contracted state of FIG. 5A.

A wide variety of means for triggering a change in pressure are possible according to embodiments. For example, a suction tube may be inserted in the drilled hole to create vacuum-like conditions. For another example, the entire environment in which the printed circuit board 100 is used or manufactured (e.g., a particular room or server rack) may undergo a change in air pressure that causes the expansion/contraction of the polymer 101.

Figure 6:
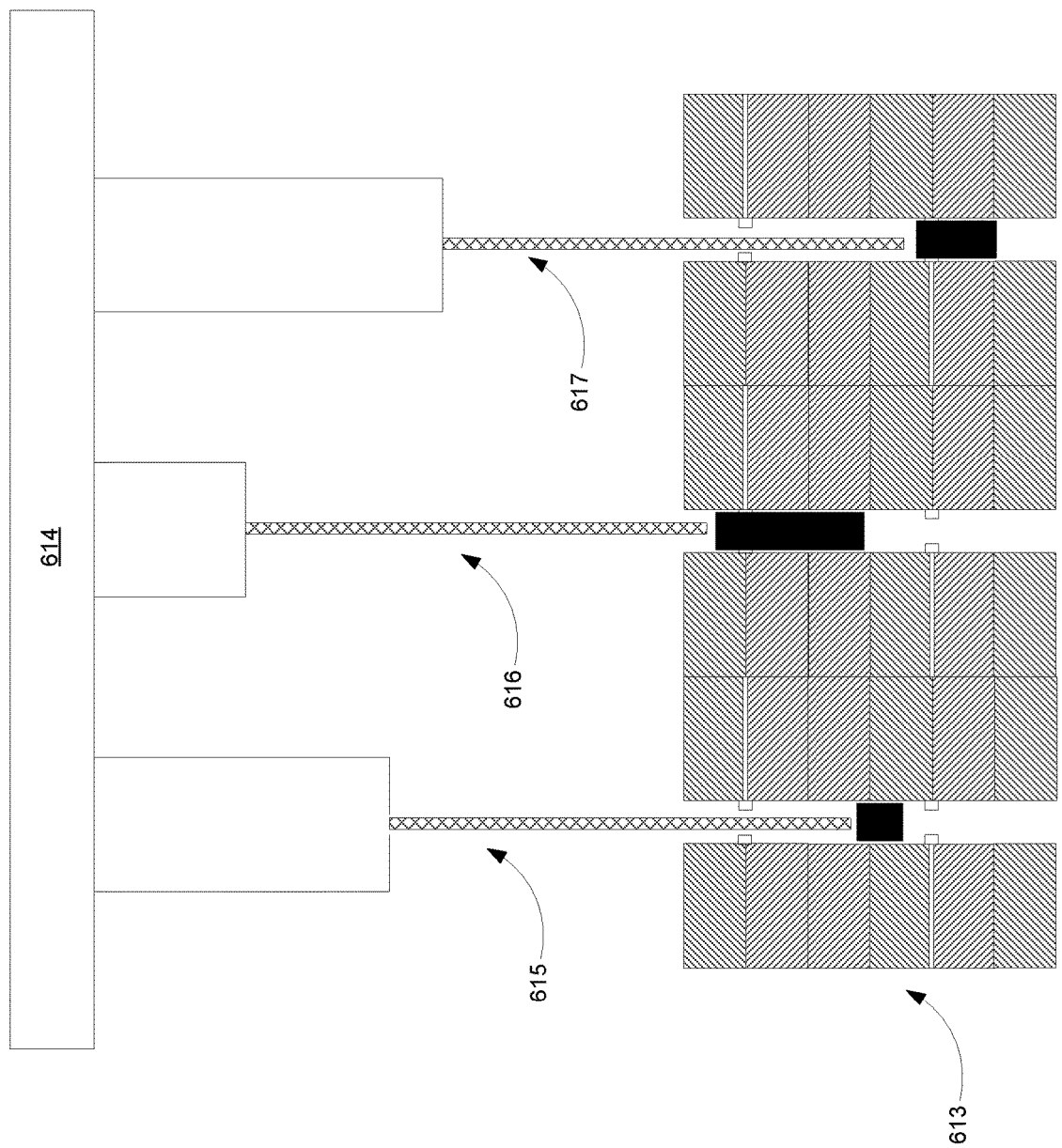
FIG. 6 illustrates a cross-sectional view of a printed circuit board with a plurality of drilled holes, wherein the drilled holes are filled with various quantities of a conductive polymer by an array of syringes, in accordance with embodiments of the present disclosure.

Referring now to FIG. 6, shown is a cross-sectional view of a printed circuit board 613 with a plurality of drilled holes, wherein the drilled holes are filled with various quantities of a conductive polymer by an array of syringes with needles/nozzles 615, 616, and 617, in accordance with embodiments of the present disclosure. In this depicted embodiment, a machine 614 working either manually or automatically uses the array of syringes (three syringes are shown for simplicity, but more may be used) to fill drilled holes with conductive polymers during the manufacturing of the printed circuit board 613. In some embodiments, only a portion of the drilled holes are filled with the conductive polymers, while a remainder of the drilled holes are either left empty or coated with a layer of copper materials to create plated through holes. The holes selected for each type of fill material (e.g., either copper or a polymer) may be determined based on the design specification for the printed circuit board 613 and the desired use for each drilled hole. Likewise, the type, quantity, and depth of the polymer inserted into each drilled hole of the printed circuit board

613 may vary depending on a variety of factors including, for example, the distance between trace layers that a particular polymer plug is designed to connect. For a specific example, a typical printed circuit board might be about one-hundred millimeters thick and a polymer plug might be about half that thickness. In some embodiments, the thickness of the polymer plug (in its contracted state) may be between ten and ninety percent of the thickness of the printed circuit board in which it is inserted.

According to embodiments, the polymer may be extruded into the drilled holes from the nozzles 615, 616, and 617 and allowed to cure before being used. The time and temperature needed for the curing process will vary depending on the type of polymer used.

Figure 7:
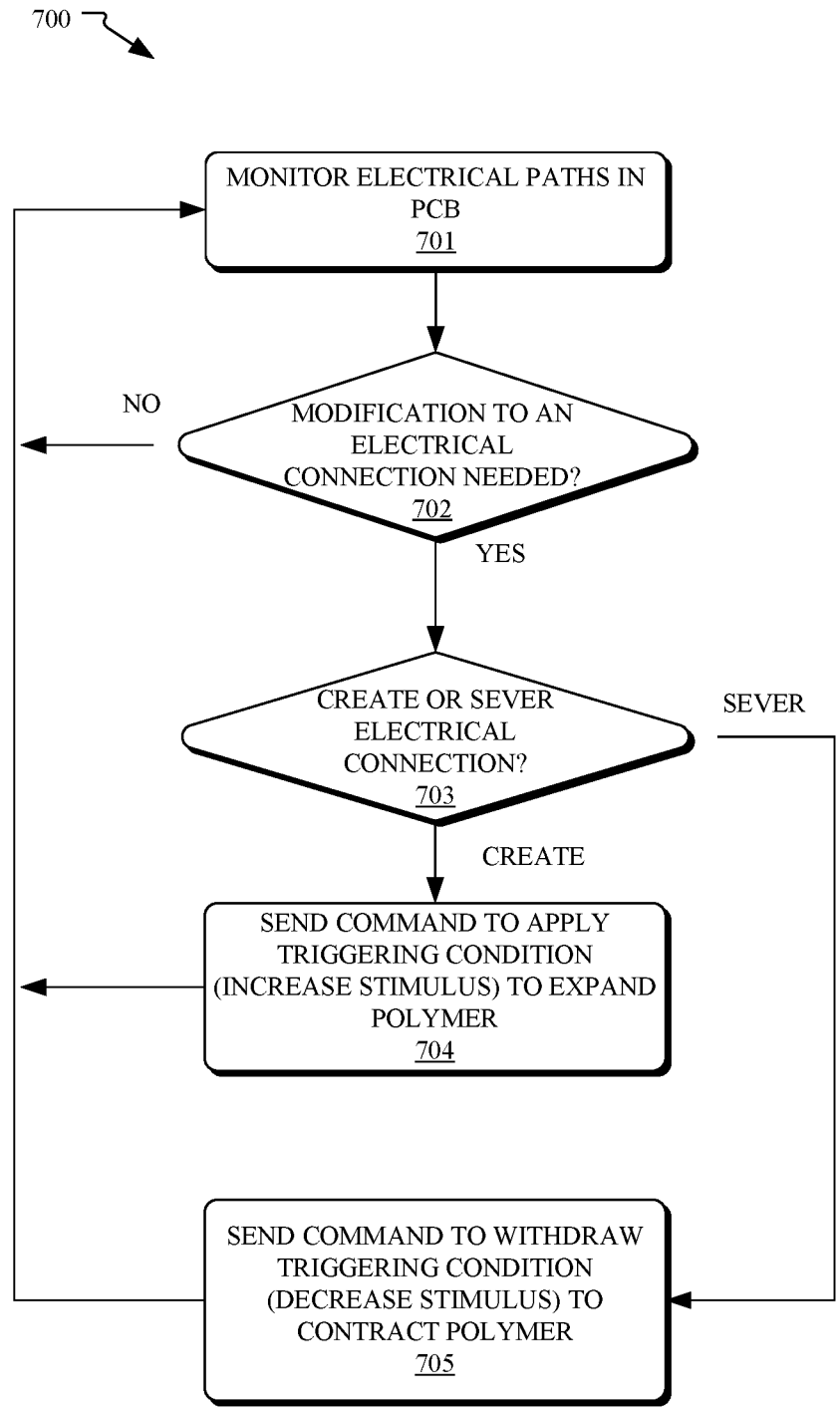
FIG. 7 illustrates a flow diagram of a method of using a processor to generate commands that cause the expansion and contraction of conductive polymers in drilled holes of a printed circuit board in order to create and sever electrical connections as necessary in a controlled manner, in accordance with embodiments of the present disclosure.

Referring now to FIG. 7, shown is a flow diagram of a method 700 of using a processor to generate commands that cause the expansion and contraction of conductive polymers in drilled holes of a printed circuit board in order to create and sever electrical connections as necessary in a controlled manner, in accordance with embodiments of the present disclosure. In some embodiments, the processor performing the method 700 may be the processor 802 depicted in FIG. 8. The processor may be located on the printed circuit board where the relevant drilled holes are located (e.g., printed circuit board 100 of FIG. 1 or printed circuit board 613 of FIG. 6) or may be in another computer that is separate from (but electrically connected to) the printed circuit board.

According to embodiments, the method 700 may begin at operation 701, wherein the processor monitors the electrical paths in the printed circuit board. In some embodiments, this includes the processor determining (or predicting) where electrical signals need to travel on the printed circuit board as components of the board communicate with each other or with components on other printed circuit boards. In some embodiments, this monitoring includes monitoring the environmental conditions in, around, or near the printed circuit board in order to detect particular conditions (e.g., thermal runaway) that will require that the printed circuit board shut down or change the manner in which it operates.

Per operation 702, the processor determines whether a modification to an electrical connection in the printed circuit board is needed. If not, then the processor returns to operation 701 and continues monitoring the printed circuit board. If a modification is needed, then, per operation 703, the processor determines whether an electrical connection in the printed circuit board (e.g., between capture pads in different trace layers) needs to be created or severed. If the creation of an electrical connection is necessary, then, per operation 704, the processor sends a command to apply a triggering condition (e.g., an increase in stimulus) in order to expand the polymer in the relevant drilled hole to create the relevant connection. If, in the alternative, the severing of an electrical connection is necessary, then, per operation 705, the processor sends a command to withdraw a triggering condition (e.g., a decrease in stimulus) in order to contract the polymer in the relevant drilled hole to sever the relevant connection.

The commands to apply or withdraw triggering conditions may be received by a wide variety of components responsible for applying triggering conditions. For example, a command to apply a triggering condition may be received by components that cause a metal filament (e.g., the metal filament 308 of FIG. 3) to heat up and expand a particular polymer plug. For another example, the command may be received by components that cause a pair of contact pads (e.g., contact pads 409 and 410 of FIG. 4) to apply a voltage that expands an electroactive polymer. For yet another example, the command may be received by components that control the pressure in the room in which the printed circuit board is housed and these components may cause the pressure in the room to decrease and the rounded, gas-filled, elastomeric microspheres to expand (e.g., as shown in view 512 of FIG. 5).

Upon the completion of operation 704 or 705, the processor returns to operation 701 and continues to monitor the printed circuit board. In some embodiments, the processor performing method 700 may be monitoring a plurality of drilled holes within the printed circuit board and adjusting the polymer in each of these drilled holes as needed. In some embodiments, the processor may cause electrical connections to made and broken very quickly (e.g., on the order of seconds or microseconds) as electrical communication signals pass through the printed circuit board.

Some embodiments of the present disclosure may offer various technical computing advantages over the prior art. These computing advantages address problems arising in the realms of computer architecture as it relates to signal interference and operating under various environmental conditions. Embodiments herein recognize that using polymers as described herein can extend the usable life of printed circuit boards or prevent safety hazards (e.g., thermal runaway conditions).

Figure 8:
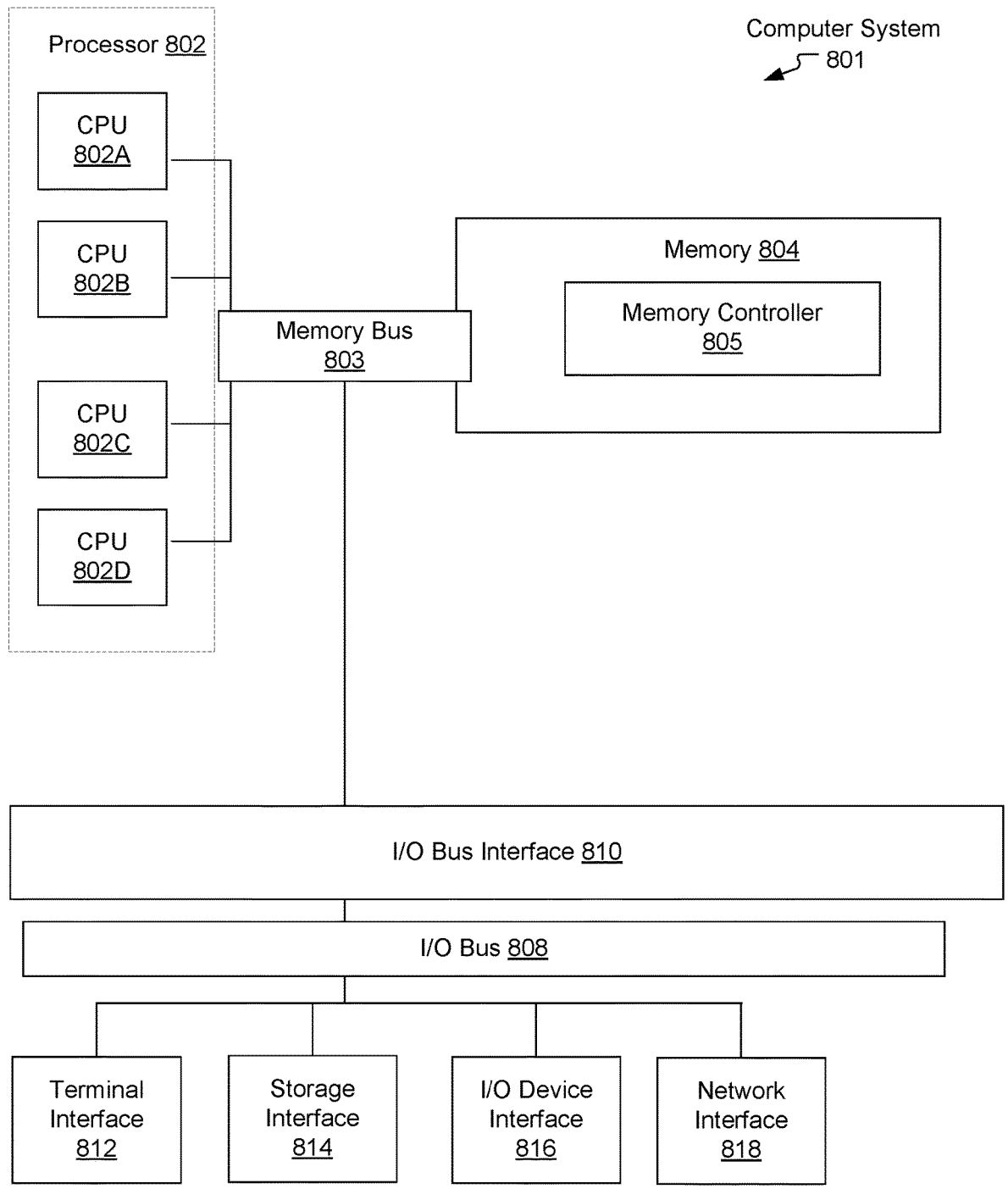
FIG. 8 illustrates a high-level block diagram of an example computer system that may be used in implementing embodiments of the present disclosure.

Referring now to FIG. 8, shown is a high-level block diagram of an example computer system (i.e., computer) 801 that may be used in implementing one or more of the methods or modules, and any related functions or operations, described herein (e.g., using one or more processor circuits or computer processors of the computer), in accordance with embodiments of the present disclosure. In some embodiments, the major components of the computer system 801 may comprise one or more CPUs 802, a memory subsystem 804, a terminal interface 812, a storage interface 814, an I/O (Input/Output) device interface 816, and a network interface 818, all of which may be communicatively coupled, directly or indirectly, for inter-component communication via a memory bus 803, an I/O bus 808, and an I/O bus interface unit 810.

The computer system 801 may contain one or more general-purpose programmable central processing units (CPUs) 802A, 802B, 802C, and 802D, herein generically referred to as the processer 802. In some embodiments, the computer system 801 may contain multiple processors typical of a relatively large system; however, in other embodiments the computer system 801 may alternatively be a single CPU system. Each CPU 802 may execute instructions stored in the memory subsystem 804 and may comprise one or more levels of on-board cache.

In some embodiments, the memory subsystem 804 may comprise a random-access semiconductor memory, storage device, or storage medium (either volatile or non-volatile) for storing data and programs. In some embodiments, the memory subsystem 804 may represent the entire virtual memory of the computer system 801, and may also include the virtual memory of other computer systems coupled to the computer system 801 or connected via a network. The memory subsystem 804 may be conceptually a single monolithic entity, but, in some embodiments, the memory subsystem 804 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures. In some embodiments, the main memory or memory subsystem 804 may contain elements for control and flow of memory used by the processor 802. This may include a memory controller 805.

Although the memory bus 803 is shown in FIG. 8 as a single bus structure providing a direct communication path among the CPUs 802, the memory subsystem 804, and the I/O bus interface 810, the memory bus 803 may, in some embodiments, comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 810 and the I/O bus 808 are shown as single respective units, the computer system 801 may, in some embodiments, contain multiple I/O bus interface units 810, multiple I/O buses 808, or both. Further, while multiple I/O interface units are shown, which separate the I/O bus 808 from various communications paths running to the various I/O devices, in other embodiments some or all of the I/O devices may be connected directly to one or more system I/O buses.

In some embodiments, the computer system 801 may be a multi-user mainframe computer system, a single-user system, or a server computer or similar device that has little or no direct user interface, but receives requests from other computer systems (clients). Further, in some embodiments, the computer system 801 may be implemented as a desktop computer, portable computer, laptop or notebook computer, tablet computer, pocket computer, telephone, smart phone, mobile device, or any other appropriate type of electronic device.

It is noted that FIG. 8 is intended to depict the representative major components of an exemplary computer system 801. In some embodiments, however, individual components may have greater or lesser complexity than as represented in FIG. 8, components other than or in addition to those shown in FIG. 8 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein, the term "each" does not necessarily equate to the term "all" as the term "all" is used colloquially. For example, the following two phrases have different meanings: "a car having a plurality of tires, each tire of the plurality of tires being fully inflated" and "a car that has all of its tires fully inflated". The former phrase would encompass a car with three fully-inflated tires (the plurality of tires) and one flat tire (not included in the plurality of tires). The latter phrase would not encompass such a car (because not all of the car's tires are fully inflated). Likewise, the phrase "a computer having a set of files, each file of the set of files being read-only" would encompass a computer having two files, one of which is read-only (and belongs to the set of files) and one of which is not read-only (and does not belong to the set of files).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method comprising applying a triggering condition to a conductive polymer, positioned in a drilled hole in a printed circuit board, that is an electrically conductive path between contact pads located in different layers of the printed circuit board, whereby the polymer vertically contracts within the drilled hole such that the electrically conductive path between the contact pads is broken.

2. The method of claim 1, wherein the applying the triggering condition is responsive to a command from a processor to sever an electrical connection between the contact pads.

3. The method of claim 1, wherein electronic components communicate across the electrically conductive path.

4. The method of claim 1, wherein the polymer comprises an electroactive polymer, and the triggering condition is voltage applied to the polymer.

5. The method of claim 4, wherein the voltage is applied via additional contact pads arranged vertically outside of the contacts pads within the drilled hole.

6. The method of claim 1, wherein the polymer comprises gas-filled microspheres, and the triggering condition is a pressure increase applied to the polymer such that the microspheres contract.

* * * * *